(12) United States Patent  
Mohammed et al.

(10) Patent No.: US 7,964,947 B2  
(45) Date of Patent: Jun. 21, 2011

(54) STACKING PACKAGES WITH ALIGNMENT ELEMENTS

(75) Inventors: Ilyas Mohammed, San Jose, CA (US); Chung-Chuan Tseng, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 450 days.

(21) Appl. No.: 11/645,242

(22) Filed: Dec. 21, 2006

(65) Prior Publication Data

US 2008/0150114 A1    Jun. 26, 2008

(51) Int. Cl.
*H01L 23/02* (2006.01)
*H01L 21/00* (2006.01)
*H05K 7/00* (2006.01)

(52) U.S. Cl. ........ 257/686; 257/774; 257/797; 361/735; 361/790; 361/792; 438/109

(58) Field of Classification Search .................. None
See application file for complete search history.

(56) References Cited

U.S. PATENT DOCUMENTS

| 6,476,476 | B1 * | 11/2002 | Glenn | 257/686 |
| 6,760,224 | B2 * | 7/2004 | Moden et al. | 361/719 |
| 7,132,311 | B2 * | 11/2006 | Akiba et al. | 438/109 |
| 7,348,726 | B2 * | 3/2008 | Terao et al. | 313/582 |
| 7,476,963 | B2 * | 1/2009 | Garth | 257/686 |

FOREIGN PATENT DOCUMENTS

JP        52075981        6/1977

* cited by examiner

*Primary Examiner* — Alonzo Chambliss

(74) *Attorney, Agent, or Firm* — Lerner, David, Littenberg, Krumholz & Mentlik, LLP

(57) ABSTRACT

A stacked microelectronic assembly is disclosed, as are different embodiments related to the same. The stacked microelectronic assembly includes a plurality of stackable microelectronic units each having a semiconductor element mounted on a substrate, and also includes alignment elements which align and stack the units one atop another. The aligned assembly may be heated to melt or to reflow the conductive bonding material between the units, thereby electrically coupling and bonding corresponding conductive terminals on each unit.

10 Claims, 6 Drawing Sheets

STACKING PACKAGES WITH ALIGNMENT ELEMENTS

BACKGROUND OF THE INVENTION

Microelectronic devices are typically provided in units or packages that provide physical and chemical protection from the environment. Such a package typically includes a thin dielectric substrate having electrically conductive terminals thereon. A microelectronic element such as a semiconductor chip, which is typically also thin, is mounted upon the substrate and is electrically connected with the terminals on the substrate. An encapsulant commonly covers at least a part of the microelectronic element, and may also cover features such as wire bonds which form part of the connection between the semiconductor chip and the terminals of the substrate. Such packages can be stacked one atop another in a common assembly, resulting in significant space saving on a circuit board. The surface area of such a stacked assembly is equal to or only slightly greater than the surface area of an individual unit.

One type of stacked package assembly known heretofore is sometimes referred to as a "ball stack." A ball stack assembly includes two or more individual units. Each unit includes a substrate and one or more microelectronic elements, which are mounted upon the substrate and electrically connected to the terminals on the substrate. The individual units are stacked one atop another, and the terminals of each individual unit are electrically coupled with terminals of other individual units by electrically conductive bonding material such as solder balls, thus forming a plurality of vertical conductors. The terminals of the bottom unit may constitute the terminals of the entire assembly, or, alternatively, an additional substrate may be mounted at the bottom of the assembly which may have terminals connected to the terminals of the various unit substrates. Ball stack packages are depicted, for example, in certain preferred embodiments of U.S. Published Patent Application Nos. 2003/0107118 and 2004/0031972, the disclosures of which are hereby incorporated by reference herein. The individual units in stacked unit assemblies can be permanently bonded in place by heating the assembly so as to melt or to reflow the solder balls, or to otherwise activate the bonding material.

However, an effective bonding process requires proper alignment of the individual units relative to each other. Misalignment of individual units can lead to improper solder connections between the units, which can result in electrical shorts or disconnects. Accordingly, there is room for improvement in stacking and aligning individual units such that the reflow process results in effective and reliable conductive bonds between the terminals of the individual units.

SUMMARY OF THE INVENTION

One aspect of this invention provides a stackable microelectronic unit comprising of a dielectric substrate and at least one semiconductor element, which is mounted on the substrate and electrically connected to conductive terminals exposed on the substrate. The substrate has an outer perimeter that is larger than the outer perimeter of the semiconductor element, so that the substrate defines an outer region extending beyond the outer periphery of the semiconductor element. The outer region of the substrate includes at least two alignment elements, separate from the terminals. For example, the alignment elements may comprise alignment cavities adapted to receive alignment components.

Another aspect of this invention provides methods for stacking and aligning the units. According to this aspect of the invention, as discussed above, the alignment elements may comprise of alignment cavities that extend through the substrate. A first alignment pin is inserted into and extends through the first alignment cavity of each unit, and a second alignment pin is likewise inserted into and extends through the second alignment cavity of each unit, whereby the units are aligned and stacked one atop another in an assembly. Thus, the terminals of the units are aligned with one another. The stacked assembly can then be heated to melt or to reflow conductive bonding material and to electrically bond the assembly together. The alignment pins can be removed after the reflow process. Another aspect of the invention includes a microelectronic assembly further comprising an alignment structure physically connecting the alignment pins to each other. The structure may be removed after the reflow process or left in place to act as a cover. Additionally, according to another aspect of the invention, the structure may be electrically and thermally conductive. Yet another aspect of the invention includes a removable base having depressions adapted to receive the alignment pins.

DETAILED DESCRIPTION

Figure 1:
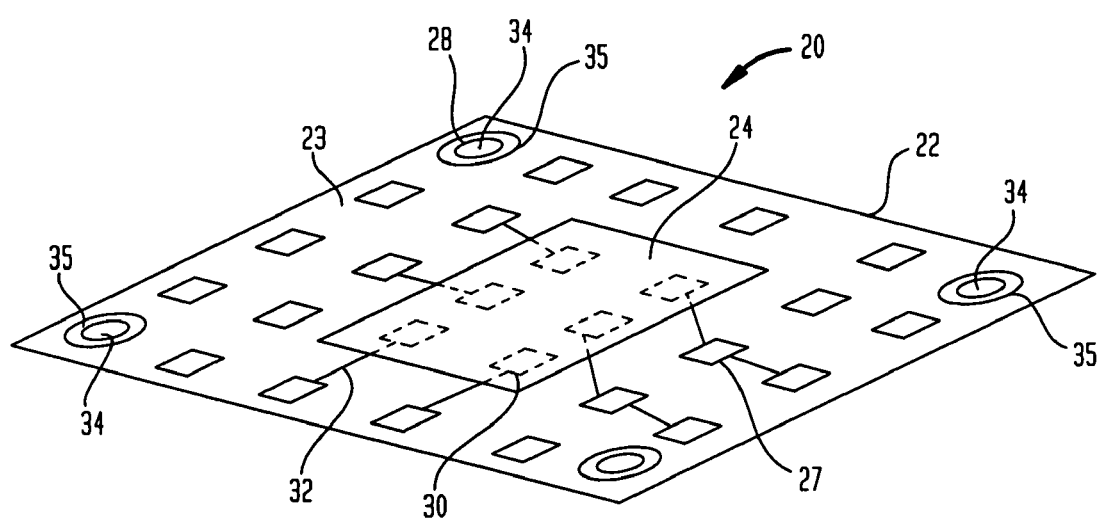
FIG. 1 is a diagrammatic perspective view of one embodiment of a stackable microelectronic unit.
Figure 2:
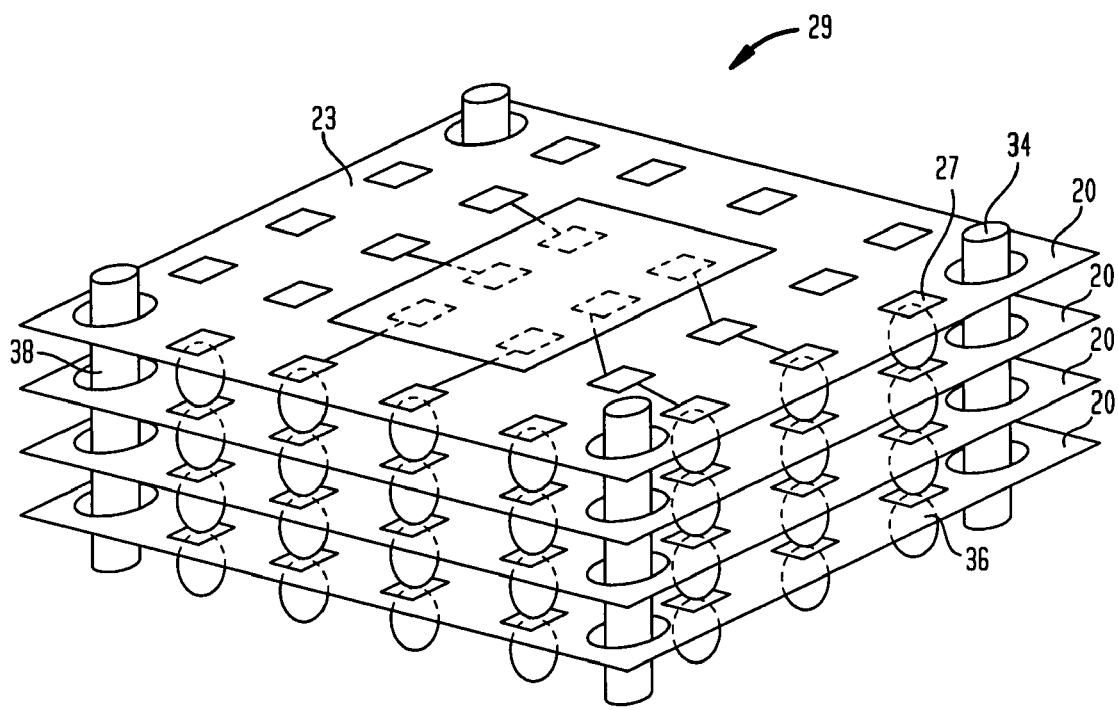
FIG. 2 is a diagrammatic perspective view of a stacked microelectronic assembly in accordance with an embodiment of the invention.

The unit 20 includes substrate 22 having a top surface 23 visible in FIG. 1 and an oppositely facing bottom surface (not shown), and a semiconductor element or chip 24. The semiconductor element 24 is mounted on the top surface 23 of substrate 22 with, for example, a dielectric adhesive (not shown). The substrate 22 includes a plurality of alignment elements 28 located in a peripheral region of the substrate 22 outside of the central region occupied by the semiconductor element 24. The substrate further includes a plurality of electrically conductive terminals 27 (see FIG. 2), exposed at the top surface 23 of substrate 22 and at the oppositely facing bottom surface (not shown) of substrate 22. For example, terminals 27 may be mounted on the top surface 23 of the substrate 22 and exposed at the bottom surface (not shown) through holes in substrate, or vice-versa. In other alternatives, each terminal 27 may include separate elements exposed at the top and bottom surfaces and electrically connected to one another by conductive vias extending through the substrate. The semiconductor element 24 has electrically conductive contacts 30 which are electrically coupled to terminals 27. The substrate 22 includes electrically conductive traces 32 which electrically interconnect some of terminals 27 to contacts 30 of the semiconductor element 24. The connections between the traces 32 and the contacts 30 of the chip 24 may be conventional wire bonds, or may include other conventional connections between the traces 32 and the contacts 30. Depending upon the type of connection used, the contact-bearing surface of the chip 24, or the opposite surface of the chip 24, may face towards the substrate 22. The alignment elements 28 include holes or alignment cavities 34 which extend from the top surface to the bottom surface of substrate 22. The alignment cavities or holes 34 desirably are formed in precise locations relative to the pattern of terminals 27. Merely by way of example, the holes 34 may be formed by mechanically punching, etching or ablating the material of the substrate 22. In one variant, the metallic material of terminals 27 is formed by a conventional process of etching a continuous metallic layer overlying the substrate 22 using a photoresist exposed to a pattern of illumination and then developed to form an etching mask used in forming the terminals 27. In one embodiment, the same patternwise illumination step can be used to form an etching mask which defines metallic rings 35. The rings 35 in turn can be used as etching masks or ablation shields during the process used to form holes 34. This provides precise positioning of the holes 34 relative to the terminals 27. Although the unit 20 depicted in FIG. 1 has four alignment cavities or holes 34, more or fewer alignment cavities may be used. Preferably, each unit 20 has two or more alignment cavities 34 disposed remotely from one another as, for example, at opposite sides or corners of the substrate 22.

An assembly according to a further embodiment of the invention (FIG. 2) includes a plurality of the stackable microelectronic units 20 as shown in FIG. 1. The units 20 are stacked one atop another. The top surface 23 and the bottom surface (not shown) of substrate 22 of each microelectronic unit 20 are substantially parallel to each other. Alignment cavities 34 of the various microelectronic units 20 are aligned with each other. Alignment pins 38 extend through alignment cavities 34 and hold the units 20 in precise alignment with one another, so that the terminals 27 on each unit 20 are aligned with one another. Conductive bonding materials such as solder balls 36 are disposed between each pair of adjacent units 20 and are aligned with and electrically couple vertically adjacent terminals 27 of each unit 20, forming an array of vertical conductors. Assembly 29 may be heated to melt or to reflow conductive bonds 36 to permanently bond assembly 29 into place, and the alignment pins 38 may be removed after the reflow process. The bonding materials 36 may be provided on the individual units 20 before the units are placed in the stack. For example, a solder ball 36 may be provided on the terminals 27 of each unit exposed at the bottom surface of the unit. During reflow, the solder balls will bond to the terminals exposed at the top surface of the next lower unit in the stack. During reflow, the units may be forcibly urged against one another to bring the assembly to a controlled height. As disclosed in the co-pending, commonly assigned United States Provisional Patent Application entitled Enabling Uniformity Of Stacking Process Through Bumpers, naming Belgacem Haba and Ilyas Mohammed as inventors, filed on or about even date herewith, the units may be provided with spaced-apart bumpers or other features so that the bumpers or other features on each unit engage the next adjacent unit. Such engagement controls the vertical positioning of each unit relative to the next adjacent unit, and thus controls the height of the stack.

Figure 3A:
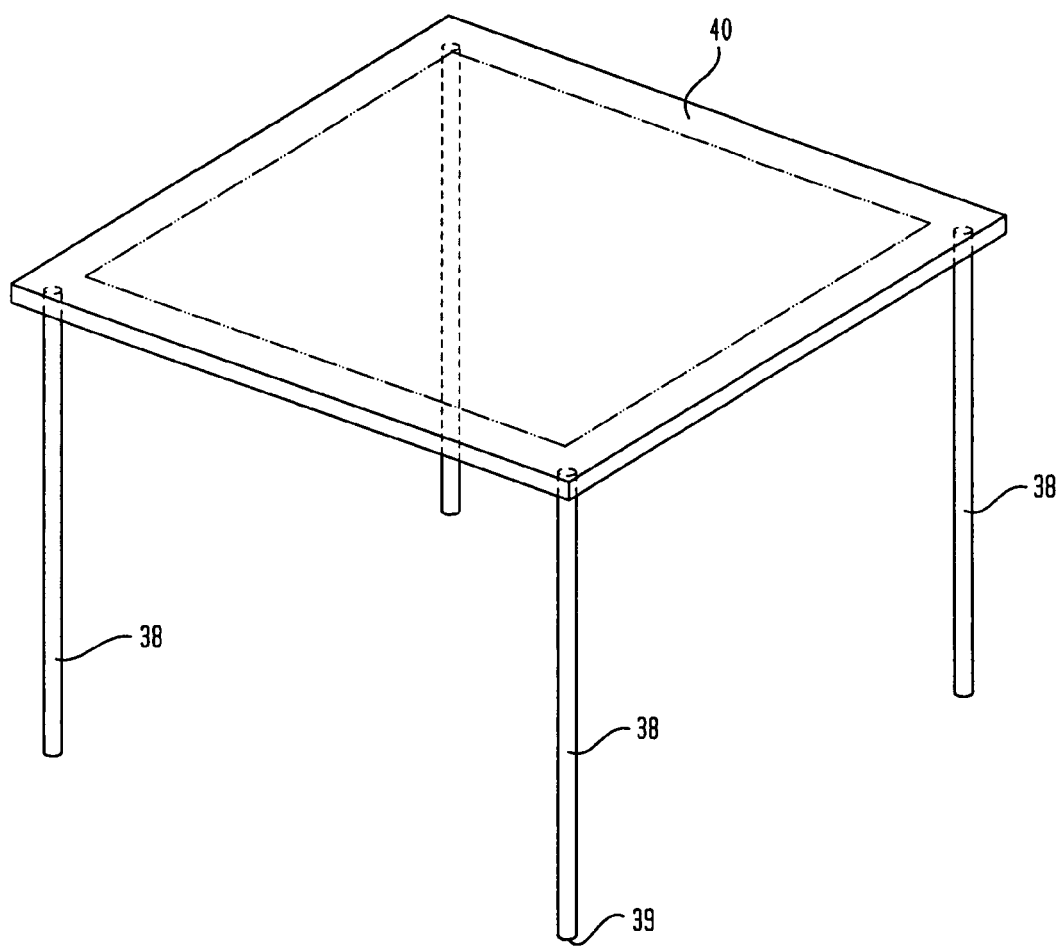
FIGS. 3A and 3B are diagrammatic perspective views of components used in assemblies according to additional embodiments of the invention.
Figure 3B:
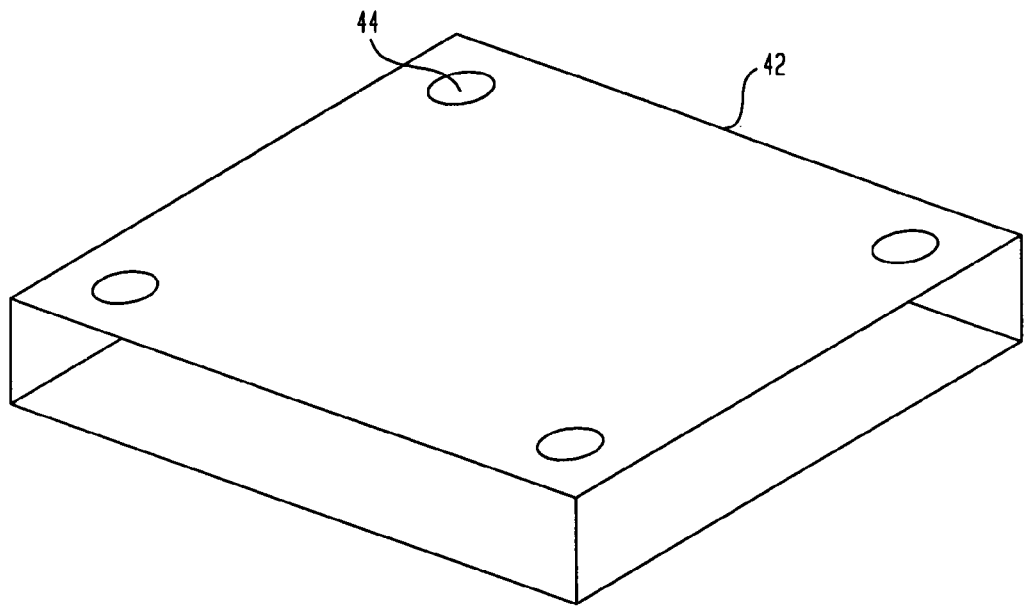

The assembly 29 may further include a structure 40, illustrated in FIG. 3a, physically connecting alignment pins 38 to each other. Structure 40 may be removed after the reflow process, or may be left in place to act as a cover for the top semiconductor element 24 of the assembly 29. The structure 40 and the alignment pins 38 may additionally be thermally conductive to improve heat dissipation. For example, where structure 40 is formed from a metallic or other thermally conductive material, structure 40 may be left in place as a heat sink to improve heat transfer from the assembly. In a further embodiment, structure 40 may be integrated with other elements such as an electrically conductive shield or Faraday cage extending over the stacked elements to protect the stacked elements against externally-applied electromagnetic radiation and magnetic fields or limit electromagnetic radiation from the stacked elements. Alternatively or additionally, the alignment elements can be electrically conductive, and may provide additional interconnections between the elements. For example, where metallic rings 35 (FIG. 1) are provided around the alignment cavities 34, such rings may be connected by traces (not shown) to the contacts of the chip, so that such rings serve as additional terminals. For example, each alignment element may serve as a ground conductor or power conductor. The electrically conductive alignment elements or pins 38 can be connected to the rings 35 by additional solder or other bonding material (not shown). Assembly 29 may also include a base plate 42 (depicted in FIG. 3b) with depressions 44 adapted to receive the ends 39 (shown in FIG. 3a) of alignment pins 38 to maintain a desired height profile of the assembly 29.

Figure 4:
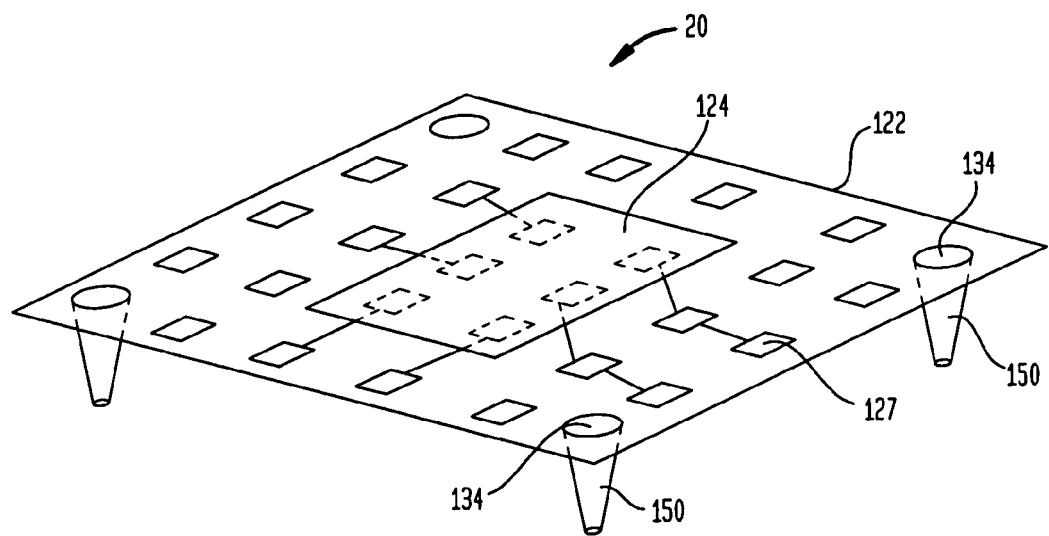
FIG. 4 is a top perspective view of another embodiment of a stackable microelectronic unit.
Figure 5:
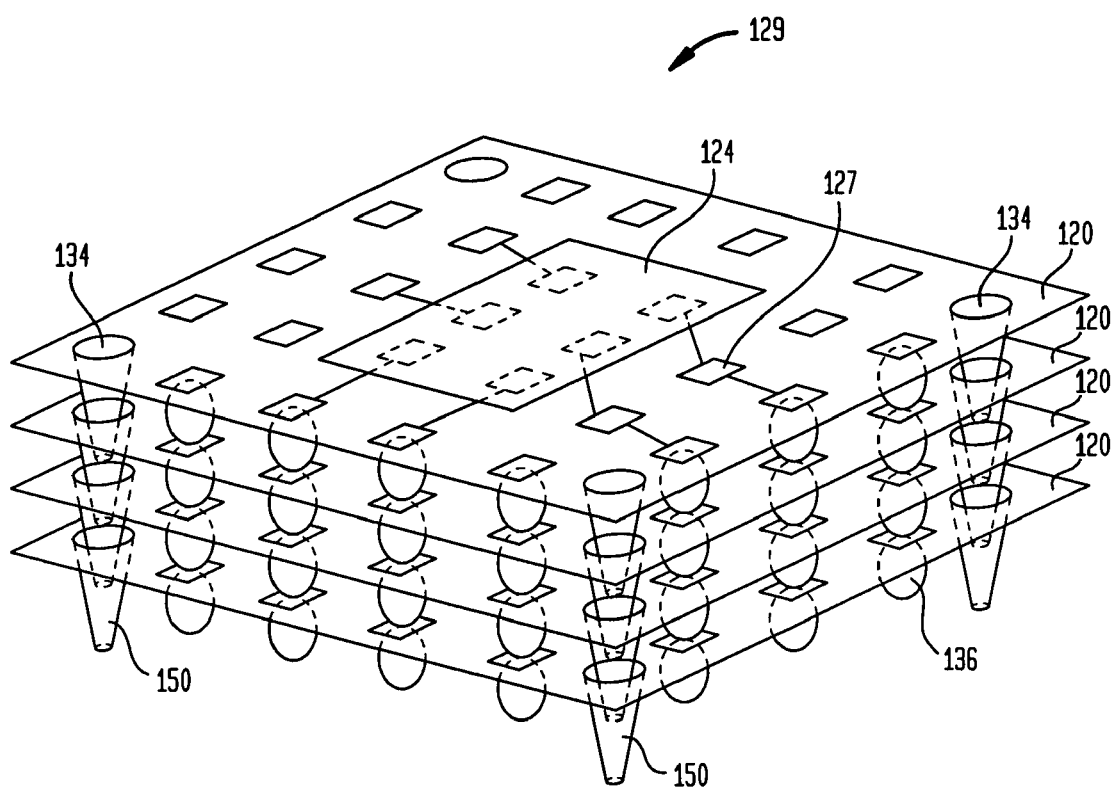
FIG. 5 is a diagrammatic perspective view of a stacked microelectronic assembly incorporating units as shown in FIG. 4.

A unit 120 according to a further embodiment of the invention (FIG. 4) includes a substrate 122 having terminals 127 and a semiconductor element or chip 124 similar to the corresponding features of the unit discussed above with reference to FIG. 1. In the embodiment of FIG. 4 as well, alignment cavities or holes 134 extend through the substrate 122. In this embodiment, however, the unit has a hollow post or pillar 150 projecting from one surface of the substrate in alignment with each alignment cavity or hole 134. Here again, pillars 150 and holes 134 desirably are formed in precise locations relative to the terminals 127. As shown in FIG. 5, the units 120 according to this embodiment can be stacked on one another to form an assembly 129. In this stacked assembly, the pillars 150 on each unit 120 are engaged in the holes 134 of an immediately adjacent unit. The engaged pillars hold the units in alignment with one another. Pillars 150 may be formed from dielectric materials or from electrically conductive materials. Solder balls 136 are disposed between each pair of adjacent units 120. As in the previous embodiments, the solder balls 136 are aligned with and electrically couple vertically adjacent terminals 127 of each unit 120 to form an array of vertical conductors.

Figure 6:
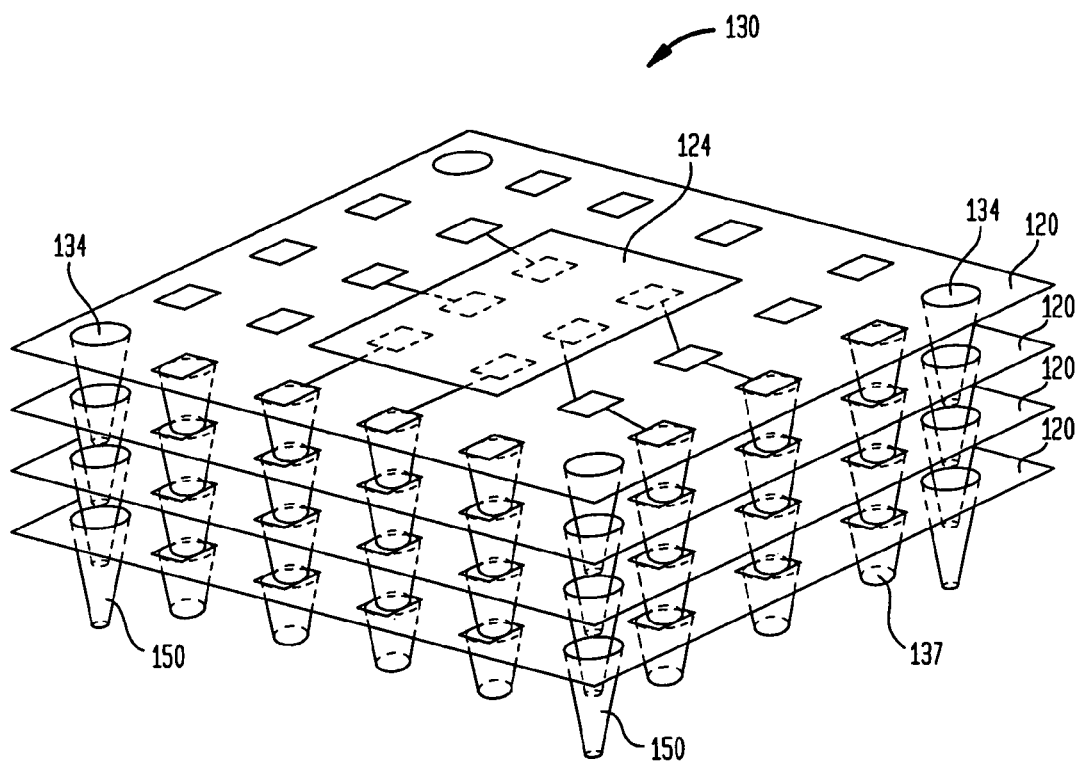
FIG. 6 is a diagrammatic perspective of another stacked microelectronic assembly.

Referring to FIG. 6, using similar reference numerals to indicate similar elements, another assembly 130 is shown that is virtually identical to FIG. 5. In this embodiment, instead of using solder balls as conductive bonding elements, conductive posts 137 are disposed between each pair of adjacent units 120. The conductive posts 137 are aligned with and electrically couple vertically adjacent terminals 127 of each unit 120 to form an array of vertical conductors. The conductive posts 137 may be frustoconical and positioned between the pillars 150 of each unit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. It is to be understood, that any type, size, shape or configuration of substrates, semiconductor chips, alignment elements, traces, terminals, and/or electrically conductive bonding material may be utilized. For example, the substrate may define a central region having a bond window, and electrical connection between the contacts of the semiconductor chip and the terminals on the substrate may be made with wire bonds extending through the bond window. The terminals on the substrate may be exposed on bottom surface, top surface, or both surfaces. Vias may be used to connect terminals and traces on the bottom surface to terminals and traces on the top surface. Additionally, the electrically conductive bonding material may be solid core solder balls, or balls constructed completely of solder. Similarly, such connection elements may include posts, columns, pins, rods, or other structural and/or conductive elements. For example, as discussed in U.S. Published Patent Application No. 20050285246 and U.S. patent application Ser. No. 11/318,164, the disclosures of which are hereby incorporated by reference herein, the conductive elements may include both pins and reflowable solder masses bonded to the pins, as well as posts or columns. The conductive elements may be formed using various known techniques including etching or plating.

The invention claimed is:

1. A stacked microelectronic assembly, comprising:
    a plurality of microelectronic units, wherein each unit comprises:
        a dielectric element having oppositely facing top and bottom surfaces;
        a semiconductor die having contacts and an outer perimeter, said semiconductor die mounted on said dielectric element;
        said dielectric element defining an outer region extending beyond said outer perimeter of said semiconductor die;
        said dielectric element having a plurality of electrically conductive terminals exposed on at least one of said surfaces, wherein at least some of said terminals are electrically coupled to said contacts;
        said dielectric element including first and second alignment cavities disposed within said outer region and extending from said top surface to said bottom surface and adapted to receive an alignment component, wherein said alignment cavities are electrically insulated from said terminals,
    wherein at least some of said terminals on each microelectronic unit are exposed at each of said top and bottom surfaces, and wherein said microelectronic units are stacked one atop another such that:
        said surfaces of all said dielectric elements are substantially parallel to each other;
        said first alignment cavities are aligned with each other;
        said second alignment cavities are aligned with each other; and
        at least some of said terminals of each microelectronic unit are aligned and electrically coupled with each other.

2. A stacked microelectronic assembly according to claim 1, further comprising a plurality of solder balls, said solder balls electrically coupling at least some of said terminals of each of said microelectronic units with each other.

3. A stacked microelectronic assembly according to claim 1, further comprising a plurality of conductive posts, said conductive posts electrically coupling at least some of said terminals of each of said microelectronic units with each other.

4. A stacked microelectronic assembly according to claim 1, further comprising a first alignment pin and a second alignment pin, said first alignment pin extending through each of said first alignment cavities, said second alignment pin extending through each of said second alignment cavities.

5. A stacked microelectronic assembly according to claim 4, further comprising a structure physically connecting said first and second alignment pins to each other.

6. A stacked microelectronic assembly according to claim 5, wherein said structure is electrically and thermally conductive.

7. A stacked microelectronic assembly according to claim 1, further comprising first and second dielectric pillars each having a first end, a second end narrower than said first end, and a recess exposed at said first end, each of said first ends affixed to one of said surfaces of said dielectric element and overlying one of said alignment cavities, said second ends of said dielectric pillars extending remotely from said dielectric element, and, said alignment cavities, said first ends, and said recesses adapted to receive said second ends of said pillars.

8. A stacked microelectronic assembly according to claim 7, wherein
    said first pillars are aligned with each other and with said first alignment cavities, wherein said second end of said first pillar of said second microelectronic unit extends through said first alignment cavity of said first microelectronic unit and into said recess of said first pillar of said first electronic unit; and
    said second pillars are aligned with each other and with said second alignment cavities, wherein said second end of said second pillar of said second electronic unit extends through said second alignment cavity of said first microelectronic unit and into said recess of said second pillar of said first electronic unit.

9. A stacked microelectronic assembly comprising:
    a plurality of stackable microelectronic units, each microelectronic unit of the microelectronic assembly comprising:
    a dielectric element having oppositely facing top and bottom surfaces, a plurality of electrically conductive terminals exposed on at least one of said surfaces;
    a semiconductor die having contacts and an outer perimeter, said semiconductor die mounted on said dielectric element; and
    said dielectric element defining an outer region extending beyond said outer perimeter of said semiconductor die,
    wherein at least some of said terminals are electrically coupled to said contacts,
    wherein said dielectric element includes first and second alignment cavities disposed within said outer region and said first and second alignment cavities extend from said top surface to said bottom surface and are adapted to receive an alignment component, said alignment cavities being separate from said terminals;
    a first alignment pin extending through each of said first alignment cavities and a second alignment pin extending through each of said second alignment cavities, and
    a structure physically connecting said first and second alignment pins to each other, wherein said structure is removable,
    wherein at least some of said terminals on each microelectronic unit are exposed at each of said top and bottom surfaces, and
    wherein each microelectronic unit is stacked one atop another such that:
    said surfaces of all said dielectric elements are substantially parallel to each other;
    said first alignment cavities are aligned with each other;
    said second alignment cavities are aligned with each other; and at least some of said terminals of each microelectronic unit are aligned and electrically coupled with each other.

10. The stacked microelectronic assembly according to claim 9, further comprising a removable base having first and second depressions adapted to receive said first and second alignment pins of said structure.

* * * * *